United States Patent
Kotaki et al.

(10) Patent No.: US 7,501,694 B2
(45) Date of Patent: Mar. 10, 2009

(54) SEMICONDUCTOR DEVICE USING MULTI-LAYER UNLEADED METAL PLATING, AND METHOD OF MANUFACTURING THE SAME

(75) Inventors: Yoshitsugu Kotaki, Kawasaki (JP); Yuuki Kanazawa, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 207 days.

(21) Appl. No.: 11/020,677

(22) Filed: Dec. 27, 2004

(65) Prior Publication Data

US 2006/0071335 A1   Apr. 6, 2006

(30) Foreign Application Priority Data

Sep. 28, 2004   (JP) .............................. 2004-282234

(51) Int. Cl.
   *H01L 23/495*   (2006.01)
(52) U.S. Cl. ...................... 257/677; 257/741; 257/748
(58) Field of Classification Search ......... 257/666–677, 257/741, 748
   See application file for complete search history.

(56) References Cited

FOREIGN PATENT DOCUMENTS

| | | | |
|---|---|---|---|
| JP | 11-330340 | * | 11/1999 |
| JP | 411330340 | * | 11/1999 |
| JP | 2000-174191 A | | 6/2000 |
| JP | 2003231988 | * | 8/2003 |

OTHER PUBLICATIONS

Japanese Office Action dated Feb. 5, 2008, issued in corresponding Japanese Application No. 2004-282234.

* cited by examiner

*Primary Examiner*—Monica Lewis
(74) *Attorney, Agent, or Firm*—Westerman, Hattori, Daniels & Adrian, LLP.

(57) ABSTRACT

A semiconductor device comprises a semiconductor integrated circuit, an external connection terminal connecting the semiconductor integrated circuit to an external device, and a plurality of tin or tin-alloy plating layers formed on the external connection terminal as multiple unleaded metal plating layers. The multiple unleaded metal plating layers comprise a first layer made of a tin alloy and provided as an inner layer of the multiple unleaded metal plating layers, the tin alloy of the first layer containing as a second element one of bismuth, silver, copper, indium, and zinc, and a second layer made of either 100% tin or a tin alloy and provided as an outer surface layer of the multiple unleaded metal plating layers, the 100% tin or the tin alloy of the second layer having a percentage of tin content greater than that of the first layer.

5 Claims, 4 Drawing Sheets

2ND TIN-ZINC LAYER 17
(ZINC CONTENT LOW,
GRAIN SIZE LARGE)

1ST TIN-ZINC LAYER 16
(ZINC CONTENT HIGH,
GRAIN SIZE SMALL)

SEMICONDUCTOR DEVICE USING MULTI-LAYER UNLEADED METAL PLATING, AND METHOD OF MANUFACTURING THE SAME

CROSS-REFERENCE TO RELATED APPLICATIONS

This application is based upon and claims the benefit of priority of Japanese Patent Application No. 2004-282234, filed on Sep. 28, 2004, the entire contents of which are herein incorporated by reference.

BACKGROUND OF THE INVENTION

1. Field of the Invention

The present invention relates to a semiconductor device having an external connection terminal formed with multi-layer unleaded metal plating, and a method of manufacturing the semiconductor device.

2. Description of the Related Art

Soldering is the widely used bonding method of electrically and mechanically connecting a semiconductor device to a printed circuit board.

In order to make connection with the solder easier, tin or tin-alloy plating is usually formed on the external connection terminal of the semiconductor device.

Most frequently used one among such alloy plating is tin-lead alloy plating, and the tin-lead alloy plating has excellent characteristics in functionality, quality, cost, etc.

Moreover, the soldering which is commonly used for the secondary mounting of the semiconductor device is also the tin-lead alloy plating, and the tin-lead alloy plating is congenial to the manufacture of the semiconductor device. Thus, the tin-lead alloy plating is conventionally used for the external connection terminals of the semiconductor device and it is excellent in view of the mounting characteristic and the reliability after the mounting.

In the process of tin-lead metal plating, the pre-treatment (etching, activation, etc.) of raw materials (iron-nickel alloy, copper alloy, etc.) is performed, and the plating of tin-lead alloy in the predetermined quantity is performed according to the electroplating method using the organic acid plating bath containing the metal ions of tin and lead after the pre-treatment of the raw materials.

Since tin and lead have the approximately same electrode potential, the control of the composition ratio of the tin-lead alloy can be easily performed. The metal ions of tin and lead can be supplied from the anode plate made of the tin-lead alloy, and it is possible to produce the tin-lead metal plating at low cost. Moreover, in view of the stability of metal plating, the ease of plating, and the cost of plating, the tin-lead alloy plating provides excellent features which are not seen in other tin alloy plating.

Japanese Laid-Open Patent Application No. 11-330340 discloses a semiconductor device having a lead (which is an electric wire) formed with multi-layer unleaded metal plating including the upper layer and the lower layer.

However, in recent years, from the viewpoint of earth environment protection, there is the outstanding anxiety about the influence of the toxicity of lead or lead alloys on the human body, especially the groundwater contamination. The restriction of the use of lead on the scale of the earth has been activated. Moreover, lead was listed as in the restriction of the use of hazardous substances (RoHS) by the Directive of the European Parliament and of the Council of Jan. 27, 2003, and it is urgently demanded to promote the unleaded production of electric devices.

In such circumstances, it is also demanded to expand the use of unleaded alloy plating on the external connection terminals of the semiconductor device, instead of the use of tin-lead alloy plating.

In the present situation, unleaded metal plating, including tin-bismuth alloy, tin-silver alloy, tin-copper alloy, etc. is under development and put in practical use. Furthermore, other unleaded metal plating, including tin-zinc alloy, tin-indium alloy, etc. are considered as candidates for the unleaded metal plating.

In addition, 100% tin metal plating is not exactly the alloy plating but it is also a candidate for the unleaded metal plating.

The 100% tin metal plating is already put in practical use but it has the problem of whisker resistance left behind. As the advantageous feature of the pure tin plating, the metal-plating processing can be easily performed at low cost. In view of this point, it can be said that it is advantageous beyond the tin-lead alloy plating, from the past actual results and from the fact that 100% tin metal plating is not the tin alloy plating.

However, as long as whisker resistance is concerned, there is no secondary element in the 100% tin metal plating which should be suppressed, and it is a metal plating with which whisker tends to occur. The time of the occurrence of whisker and the scale of whisker after the products from the factory are delivered to the market cannot be predicted. There is the possibility that it becomes a serious problem.

Recently, there have been proposed some kinds of the 100% tin plating with which whisker does not easily occur. However, the occurrence mechanism of whisker is not solved completely, but they are merely the results of the experiments and still cannot be put in practical use. For this reason, it is necessary to take the great risk for adopting the 100% tin plating.

What are mainly put in practical use as the current unleaded metal plating for the time being are the tin-bismuth alloy, the tin-silver alloy, and the tin-copper alloy. These unleaded metal alloys have some merits and some demerits, and there is none of them that is equivalent to the tin-lead alloy plating in all the viewpoints of the quality of the metal-plating coat, the stability of the metal-plating processing, the cost, etc., respectively.

As the problems of the current unleaded metal plating candidates mentioned above, the merits and the demerit of each of the respective unleaded metal plating candidates will be explained.

First, the tin-bismuth alloy metal plating has the comparatively omnipotent character, and its proliferation level is the highest among the unleaded alloy plating candidates for the semiconductor device.

The shortcoming of the tin-bismuth alloy metal plating is the characteristics of bismuth which makes this alloy metal hard and brittle, and it causes the occurrence of cracks of the metal-plating coat due to the bending of the external terminals of the semiconductor device as well as the lowering of the solder bonding strength after the secondary mounting. In addition, the inclusion of bismuth in the alloy metal plating makes the solder wettability fall, which is also one of the concern items.

It is known that the tin-bismuth alloy metal plating has a high whisker resistance as compared with other unleaded metal plating. However, because of the above-mentioned shortcoming, it is difficult to raise the content ratio of bismuth of the tin-bismuth alloy metal plating so much. The actual condition is that the level of whisker resistance which is equivalent to the level of the tin-lead alloy plating is not secured by the current tin-bismuth alloy metal plating. Although the tin-bismuth alloy metal plating has some problems, they are comparatively minor defects, and the quality which can be equivalent to the practical-use level is secured mostly.

Next, the tin-silver alloy metal plating has a comparatively good reliability after the secondary mounting, and it is the advantage that the tin-silver alloy metal plating is congenial to the tin-silver alloy which is the current unleaded secondary mounting solder.

The shortcoming of the tin-silver alloy metal plating is that the metal-plating coat is easy to corrode, which causes the problems, such as discoloration of the metal plating and migration. Furthermore, the tin-silver alloy metal plating has also some problems that its whisker resistance is inferior to that of the tin-bismuth alloy metal plating, and that the solder wettability falls due to the inclusion of silver therein.

Moreover, also except functionality, the stability of the metal-plating liquid is poor, which causes the problem that the running cost including the metal-plating liquid adjustment etc. becomes very high.

The environment where the tin-silver alloy metal plating can be used is limited, and the cost becomes high. However, since the reliability after the secondary mounting is comparatively good, the tin-silver alloy metal plating is used in many cases in the environment where the tin-bismuth alloy metal plating cannot be used.

Finally, the tin-copper alloy metal plating is comparatively easy to use, and the cost is comparatively low. But the shortcoming of the tin-copper alloy metal plating is that it has a low whisker resistance and a poor solder wettability. Especially, the environment where the tin-copper alloy metal plating can be used is limited.

Furthermore, there is also the problem in that any technique which measures the metal-plating coat composition and thickness on the copper material in non-destructive manner is not established. Moreover, although it is comparatively easy to use, the composition of copper which becomes eutectic in tin-copper is 1% or less, and it is necessary to set the content ratio of copper as low as possible when the influence on the solder wettability is taken into consideration.

For this reason, the content ratio of copper in the order of 1% will be set up in the actual metal-plating process. However, the numerical value is extremely low, the management of the content ratio of copper is very difficult. In addition, it is the limit also as measuring instrument accuracy, and managing as the product warranties is hardly carried out for the practical use.

Moreover, in the latest report, degradation of the tin-copper plating liquid is severe, and the adjustment by the supplement cannot be performed. As long as the cost in the long run is concerned, it cannot be said that the expense is cheap.

On the other hand, in the tin-bismuth alloy metal plating method disclosed in Japanese Laid-Open Patent Application No. 11-330340, the bismuth content of the lower layer in the tin-bismuth alloy metal plating is low, and the bismuth content of the upper layer is high. It is difficult to overcome the problems, such as the occurrence of cracks of the metal-plating coat due to the bending of the external terminals of the semiconductor device as well as the lowering of the solder bonding strength after the secondary mounting.

SUMMARY OF THE INVENTION

An object of the present invention is to provide an improved semiconductor device in which the above-mentioned problems are eliminated.

Another object of the present invention is to provide a semiconductor device having an external connection terminal formed with improved multi-layer unleaded metal plating which can compensate for the demerits of the respective unleaded metal alloy plating candidates from the viewpoint of functionality and can harness the merits of the respective unleaded metal alloy plating candidates.

Another object of the present invention is to provide a method of manufacturing a semiconductor device having an external connection terminal formed with improved multi-layer unleaded metal plating which can compensate for the demerits of the respective unleaded metal alloy plating candidates from the viewpoint of functionality and can harness the merits of the respective unleaded metal alloy plating candidates.

The above-mentioned objects of the present invention are achieved by a semiconductor device which comprises: a semiconductor integrated circuit; an external connection terminal connecting the semiconductor integrated circuit to an external device; and a plurality of tin or tin-alloy plating layers formed on the external connection terminal as multiple unleaded metal plating layers, wherein the layers comprise: a first layer made of a tin alloy and provided as an inner layer of the multiple unleaded metal plating layers, the tin alloy of the first layer containing as a second element one of bismuth, silver, copper, indium, and zinc; and a second layer made of either 100% tin or a tin alloy and provided as an outer surface layer of the multiple unleaded metal plating layers, the 100% tin or the tin alloy of the second layer having a percentage of tin content greater than that of the first layer.

According to the semiconductor device of the present invention, the following effects can be acquired by forming the multi-layer unleaded metal plating layers on the external connection terminal in which the percentage of tin content of the surface layer is larger than that of the inner layer (namely, the percentage of content of the second element of the surface layer is smaller than that of the inner layer).

In the case of the tin-bismuth alloy, the influence of bismuth which degrades the solder wettability can be reduced by lowering the percentage of bismuth content of the surface metal-plating layer. For the same reason, the problem of the metal-plating cracks of the surface metal-plating layer can be reduced.

In addition, the percentage of bismuth content of the inner layer is raised, and the effect of whisker resistance can be enlarged since the inner layer serves as a barrier layer to the whisker. Furthermore, it is possible to reduce the total amount of bismuth in the unleaded metal plating coat, and the influence of bismuth to the reliability after the secondary mounting becomes small and it is possible to secure high reliability.

In the case of the tin-silver alloy, the influence to degradation of the solder wettability and corrosion can be reduced, similar to the tin-bismuth alloy, by making the percentage of silver content of the surface layer smaller than that of the inner layer. In addition, the whisker resistance can be raised by making the percentage of silver content of the inner layer large.

In the case of the tin-copper alloy, the solder wettability can be improved, and the inhibition effect over the whisker can be increased by raising the percentage of copper content of the inner layer to be larger than that of the surface layer. In addition, the percentage of copper content of the whole metal plating coat can be also increased, and it is possible to raise the copper content to the level that can be managed.

According to the semiconductor device of the present invention, the following effects can be acquired by forming the multi-layer unleaded metal plating layers on the external connection terminal in which the plating grain size of the surface layer is larger than that of the inner layer.

In the inner layer, the fine metal-plating grain is created, and the adhesion to the base material of the external connection terminal can be secured. In the surface layer, the coarse grain is created, and the whisker resistance can be improved by the coarse-grain metal plating layer of the surface layer.

One major factor of the whisker is the residual stress between the particles at the time of metal plating, and the absolute quantity of the residual stress between the particles can be decreased by forming the surface layer with the metal-plating coat of the coarse grain. In addition, if the surface layer of the coarse grain is formed, the area of the crevice between the particles can be decreased, which serves in favor of the heat resistance and the moisture resistance, and the solder wettability over an extended period of time can be kept good.

If the grain of the metal plating layer is made coarse, some problems (for example, deterioration of the appearance and the initial solder wettability, etc.) may arise depending on the kind of the metal plating used. However, it is possible to avoid such problems in this case by providing the three-layer lamination structure of the multi-layer unleaded metal plating layers in which the layer of the coarse grain is inserted between the surface layers which are made of the fine grain.

Conventionally, when the multi-layer metal plating processing is performed, two metal-plating processing baths are required if it is the two-layer metal plating. To the contrary, the multi-layer metal-plating processing according to the manufacture method of the present invention can be performed by using the same metal-plating processing bath and changing the processing conditions, such as the current density. The multi-layer metal-plating coats of the two or more layers can be formed, and the cost and the man-hours of the multi-layer metal-plating processing which are equivalent to the conventional single-layer metal plating processing can be attained.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of the preferred embodiments of the present invention with reference to the accompanying drawings.

Figure 1:
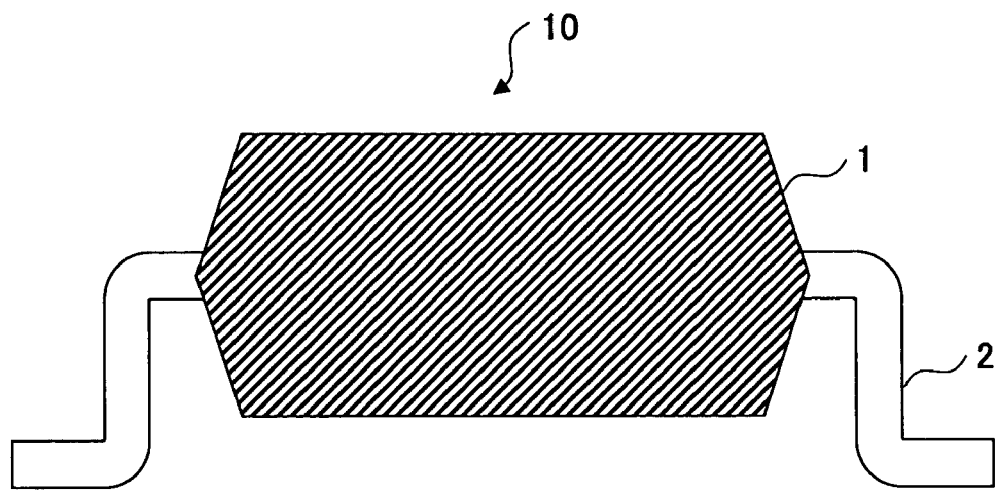
FIG. 1 is a diagram showing the composition of a semiconductor integrated circuit device in which the semiconductor device of the invention is embodied.
Figure 3:
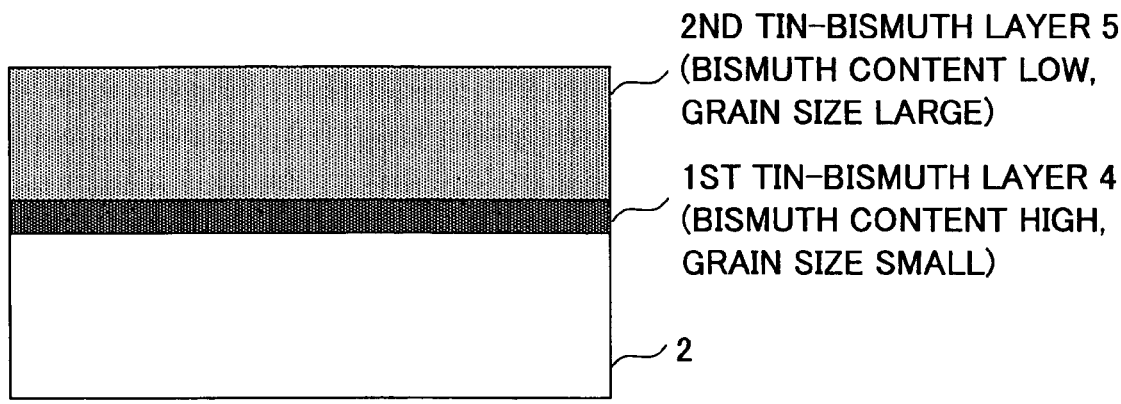
FIG. 3 is a cross-sectional view showing the composition of an example of the multi-layer unleaded metal plating layers formed on a lead of the semiconductor integrated circuit device of FIG. 1 using the multi-layer unleaded metal-plating method in a first preferred embodiment of the invention.

FIG. 1 shows the composition of a semiconductor integrated circuit device in which the semiconductor device according to the invention is embodied. FIG. 3 is a cross-sectional view showing the composition of an example of the multi-layer unleaded metal plating layers formed on the lead of the semiconductor integrated circuit device of FIG. 1 using the multi-layer unleaded metal-plating method in the first preferred embodiment of the invention.

The multi-layer unleaded metal-plating method of the present embodiment is the method which forms the two different unleaded tin-alloy plating layers (which is inclusive of a 100% tin plating layer) on the base material of the lead as the inner layer and the surface layer.

The semiconductor integrated circuit device 10 of FIG. 1 comprises the IC package 1, and the lead 2 which is an external connection terminal (electric wire) which connects the semiconductor integrated circuit in the IC package 1 to an external circuit (not shown). In order to facilitate the bonding to the secondary mounting substrate, the multi-layer unleaded metal plating layers are formed on the lead 2. The lead 2 is usually made of either an iron-nickel alloy or a copper alloy.

Figure 2:
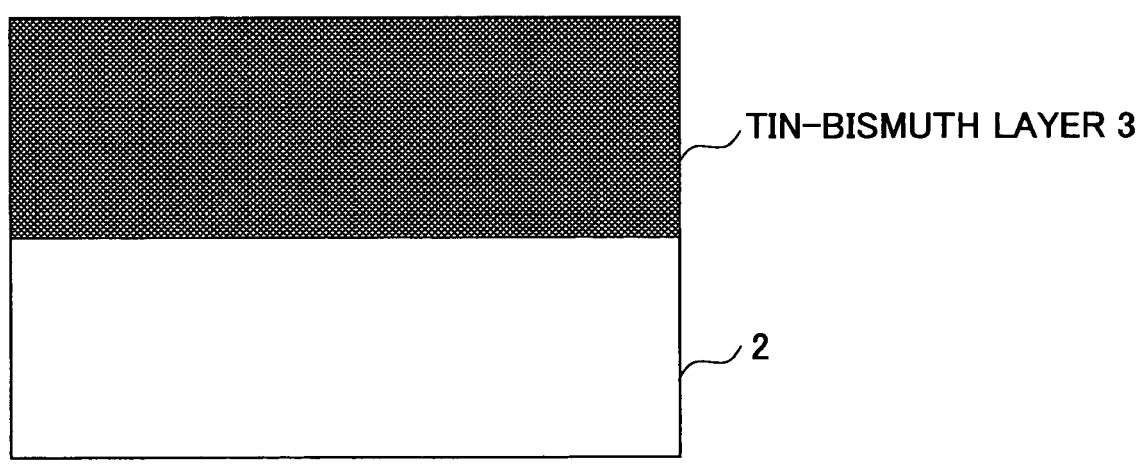
FIG. 2 is a cross-sectional view showing the composition of a lead of the semiconductor integrated circuit device of FIG. 1 in which the metal-plating processing is performed using the conventional metal-plating method.

FIG. 2 is a cross-sectional view showing the composition of the lead of the semiconductor integrated circuit device of FIG. 1 in which the metal-plating processing is performed using the conventional metal-plating method.

In this case, it is supposed that the tin-bismuth alloy metal-plating layer is formed by the conventional metal-plating method, for the purpose of comparison with the multi-layer unleaded metal-plating method of the present embodiment. In the example of FIG. 2, the tin-bismuth metal-plating layer 3 is formed on the lead 2 uniformly.

The composition of the metal-plating layer 3 is usually tin 97% and bismuth 3%, and the thickness of the layer 3 is about 10 micrometers.

When compared with the conventional metal-plating method, according to the multi-layer unleaded metal-plating method of the present embodiment shown in FIG. 3, the first tin-bismuth metal-plating layer 4 is formed on the lead 2 as being the inner layer. The composition of the layer 4 is, for example, tin 96% and bismuth 4%, and the thickness of the layer 4 is about 2 micrometers. Thus, the layer 4 is formed as being a comparatively thin film.

Moreover, in the present embodiment, the second tin-bismuth metal-plating layer 5 is formed on the metal-plating layer 4 as being the surface layer. The composition of the layer 5 is, for example, tin 99% and bismuth 1%, and the thickness of the layer 5 is about 8 micrometers.

Furthermore, according to the multi-layer unleaded metal-plating method of the present embodiment, the multi-layer formation of the two metal-plating layers is carried out so that the grain size of the first tin-bismuth metal-plating layer 4 is comparatively small (about 1 micrometer) and the grain size of the second tin-bismuth metal-plating layer 5 is comparatively large (about 5 micrometers).

In the multi-layer unleaded metal plating of the present embodiment, the increased ratio of the bismuth content of the first tin-bismuth metal-plating layer 4 formed as the inner layer serves as the effective barrier layer to the whisker, and the fine grain is formed in the layer 4 serves to raise the adhesion to the base material.

Furthermore, the first tin-bismuth metal-plating layer 4 used as the inner layer is formed as a thin film with about 2 micrometer thickness, and it is possible to provide the metal plating layer which can adequately withstand the bending stress of the lead 2. Even if the metal-plating crack arises, the second tin-bismuth metal-plating layer 5 used as the upper layer will not break, and there will be no practical problem.

By reducing the bismuth content of the second tin-bismuth metal-plating layer 5 used as the surface layer, it is possible to eliminate the problems of the solder wettability and the metal-plating crack due to from the inclusion of bismuth. In addition, the increased ratio of the bismuth content of the first tin-bismuth metal-plating layer 4 serves as the efficient barrier layer to the whisker, and the whisker resistance can be secured by enlarging the grain size of the second tin-bismuth metal-plating layer 5. The whisker resistance effect which is equivalent to the level of the tin-lead alloy plating can be acquired.

Furthermore, the surface metal-plating layer which is excellent in the heat resistance and the moisture resistance can be created by forming the coarse grain of the second tin-bismuth metal-plating layer 5.

In addition to the above improvement effects, the percentage of the bismuth content of the whole metal-plating layers can be reduced to about 1.6% which is one half of 3% of the normal percentage of the bismuth content, and it is possible to considerably reduce the deterioration of the solder bonding strength after the secondary mounting and the occurrence of the lift-off (the solder peeling by the segregation of bismuth) which becomes the problem with the reflow soldering. It is also possible to provide high reliability to the mounting.

Figure 8:
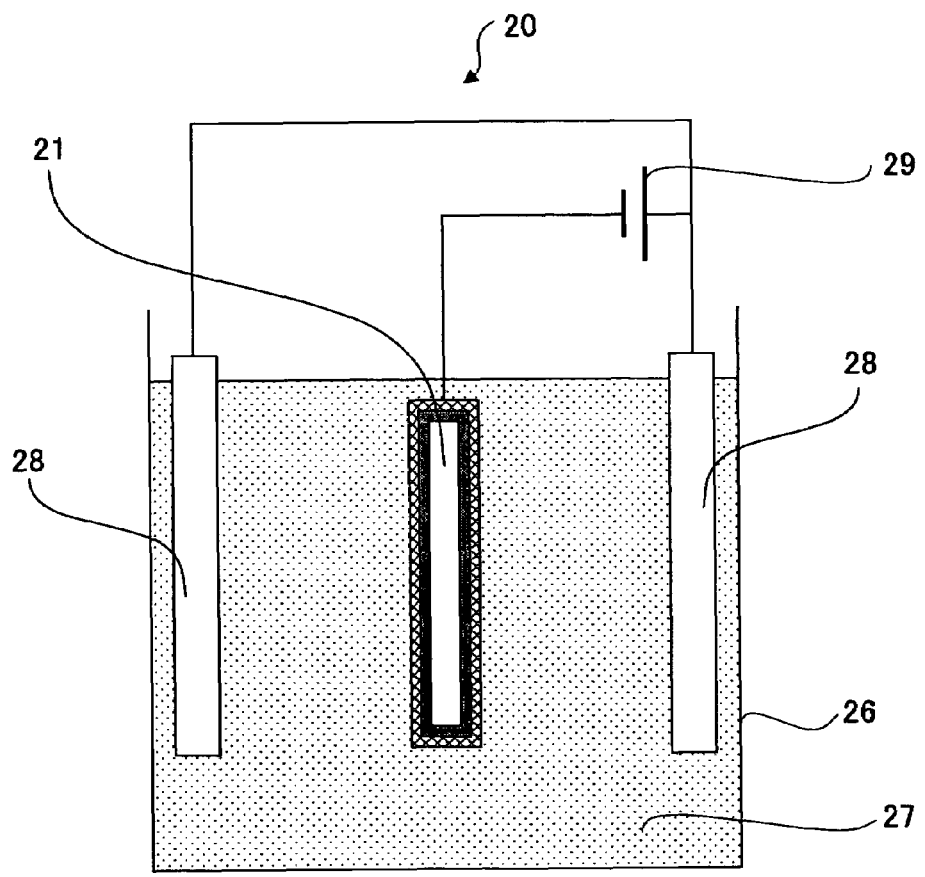
FIG. 8 is a diagram showing the composition of the metal-plating processing device for realizing the manufacture method of the semiconductor device using the multi-layer unleaded metal-plating method of the invention.

FIG. 8 shows the composition of the metal-plating processing device for realizing the manufacture method of the semiconductor device using the multi-layer unleaded metal-plating method of the invention.

Different metal-plating processing baths are usually required when the multi-layer metal-plating processing is performed using the conventional multi-layer metal plating method. However, according to multi-layer unleaded metal-plating method of the invention, the multi-layer unleaded metal-plating processing can be performed using a single metal-plating processing bath.

In the metal-plating processing device 20 of FIG. 8, the metal-plating processing bath 26 is filled with the metal-plating liquid 27 of the organic acid system in which the tin ions and the bismuth ions are dissolved.

The plates of tin or platinum-titanium are immersed in the metal-plating liquid 27 as the anodes 28. The anodes 28 are connected to the power supply 29. The plate 21 (which is, for example, the external connection terminal, like the lead 2) is connected to the minus side of the power supply 29, and it is immersed in the metal-plating liquid 27.

The metallic ions in the metal-plating liquid 27 are electrically deposited on the plate 21 by passing the electric current from the power supply 29.

Next, a description will be given of an example of the metal-plating processing as an example of the multi-layer unleaded metal-plating formation method by using the same metal-plating processing bath as shown in FIG. 8 and changing the current density.

First, the electrodeposition processing is performed using the metal-plating processing device 20 for 240 seconds with the current density of 1 A/dm$^2$. The metal-plating coat of bismuth content high and grain size large (for example, the composition of tin 96% and bismuth 4%, the thickness of 2 micrometers, and the grain size of 1 micrometer) is formed on the lead 2, which is used as the first tin-bismuth layer 4.

Subsequently, the current density is changed to 10 A/dm$^2$. The electrodeposition processing is performed the metal-plating processing device 20 for 100 seconds with the current density of 10 A/dm$^2$. The metal-plating coat of bismuth content low and grain size large (for example, the composition of tin 99% and bismuth 1%, the thickness of 8 micrometers, and the grain size of 5 micrometers) is formed on the first tin-bismuth layer 4, which is used as the second tin-bismuth layer 5.

Control of the amount of bismuth separating in the above-mentioned embodiment makes use of the substitution reaction which is produced according to the difference in the electrode potential between tin and bismuth. The substitution reaction is the phenomenon in which the separated tin is replaced by the bismuth since the electrode potential of bismuth is higher than the electrode potential of tin. It is confirmed that the substitution reaction progresses per unit time regardless of whether the energization occurs.

Using the above substitution reaction, it is possible to form the high-content bismuth layer (the first tin-bismuth layer 4) with a large amount of the substitution by carrying out the metal-plating processing slowly with small electric current. And it is possible to form the low-content bismuth layer (the second tin-bismuth layer 5) with a small amount of the substitution by carrying out the metal-plating processing quickly with large electric current.

Concerning the control of the separating grain, the grain size of the separating metal by the current density varies depending on the kind of the metal-plating liquid. It is necessary to choose a suitable metal-plating liquid.

In the above-mentioned embodiment, in order to form the fine-grain metal-plating coat at the time of passing of the small electric current, it is necessary to choose a metal-plating liquid with which about 1 A/dm$^2$ is used as the optimal processing conditions (which is called the low-speed metal-plating liquid). If such metal-plating liquid is chosen, it is possible to form the coarse-grain metal-plating coat at the time of passing of the large electric current exceeding the limiting current density.

Next, a description will be given of the examples of the multi-layer tin-silver alloy metal-plating layers and the multi-layer tin-copper alloy metal-plating layers.

Figure 4:
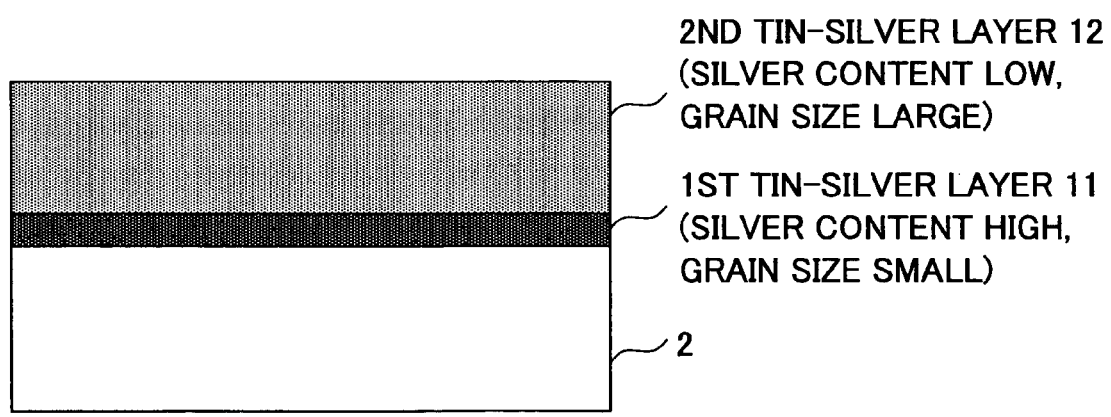
FIG. 4 is a cross-sectional view showing the composition of another example of the multi-layer unleaded metal-plating layers formed using the multi-layer unleaded metal-plating method in the first preferred embodiment of the invention.

FIG. 4 shows an example of the multi-layer tin-silver metal-plating layers formed using the multi-layer unleaded metal-plating method of the present embodiment.

As shown in FIG. 4, the first tin-silver metal-plating layer 11 is formed on the lead 2 as being the inner layer. The composition of the layer 11 is, for example, tin 90% and silver 10%, and the thickness of the layer 11 is about 2 micrometers. Thus, the layer 11 is formed as being a comparatively thin film.

Moreover, in the present embodiment, the second tin-silver metal-plating layer 12 is formed on the metal-plating layer 11 as being the surface layer. The composition of the layer 12 is, for example, tin 99% and silver 1%, and the thickness of the layer 12 is about 8 micrometers.

Furthermore, according to the present embodiment, the multi-layer formation of the two metal-plating layers is carried out so that the grain size of the first tin-silver metal-plating layer 11 is comparatively small (about 1 micrometer) and the grain size of the second tin-silver metal-plating layer 12 is comparatively large (about 5 micrometers).

In the multi-layer unleaded metal plating of the present embodiment, the increased ratio of the silver content of the first tin-silver metal-plating layer 11 formed as the inner layer serves as the effective barrier layer to the whisker, and the reduced ratio of the silver content of the second tin-silver metal-plating layer 12 formed as the surface layer serves to improve the problems of the solder wettability and the metal-plating corrosion resulting from the inclusion of silver.

Figure 5:
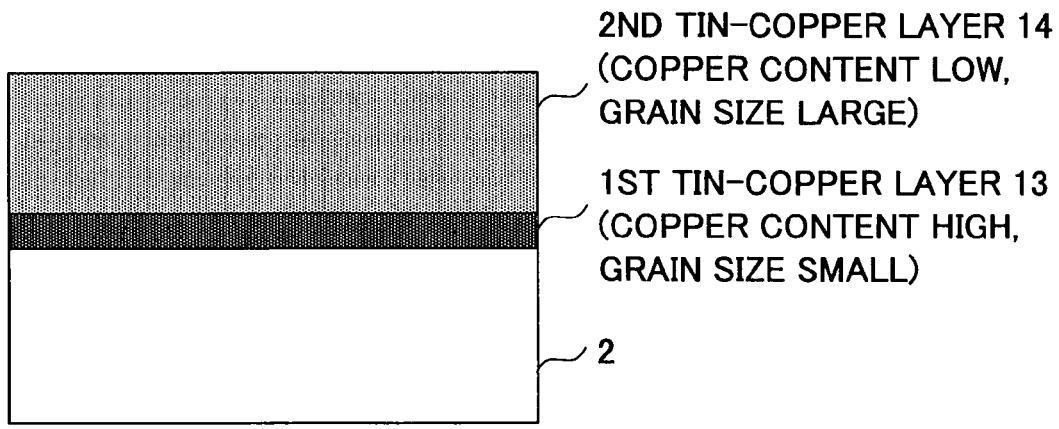
FIG. 5 is a cross-sectional view showing the composition of another example of the multi-layer unleaded metal-plating layers formed using the multi-layer unleaded metal-plating method in the first preferred embodiment of the invention.

FIG. 5 shows another example of the multi-layer tin-copper metal plating layers formed using the multi-layer unleaded metal-plating method of the present embodiment.

As shown in FIG. 5, the first tin-copper metal-plating layer 13 is formed on the lead 2 as being the inner layer. The composition of the layer 13 is, for example, tin 90% and copper 10%, and the thickness of the layer 13 is about 2 micrometers. Thus, the layer 13 is formed as being a comparatively thin film.

Moreover, in the present embodiment, the second tin-copper metal-plating layer 14 is formed on the metal-plating layer 13 as being the surface layer. The composition of the layer 14 is, for example, tin 99% and copper 1%, and the thickness of the layer 14 is about 8 micrometers.

Furthermore, according to the multi-layer unleaded metal-plating method of the present embodiment, the multi-layer formation of the two metal-plating layers is carried out so that the grain size of the first tin-copper metal-plating layer 13 is comparatively small (about 1 micrometer) and the grain size of the second tin-copper metal-plating layer 14 is comparatively large (about 5 micrometers).

In the multi-layer unleaded metal plating of the present embodiment, the increased ratio of the copper content of the first tin-copper metal-plating layer 13 formed as the inner layer serves as the effective barrier layer to the whisker. And the reduced ratio of the copper content of the second tin-copper metal-plating layer 14 formed as the surface layer serves to extensively improve the solder wettability.

In addition, the percentage of the copper content of the whole metal-plating coat can be also increased, and it is possible to easily manage the composition of the metal-plating coat.

The above-described method of production of the tin-bismuth metal plating explained with FIG. 8 is similarly used for the production of both the tin-silver metal plating and the tin-copper metal plating mentioned above.

That is, using the substitution reaction, it is possible to form the high-content second-element layer (the layer 11 or 13) with a large amount of the substitution by carrying out the metal-plating processing slowly with small electric current. And it is possible to form the low-content second-element layer (the layer 12 or 14) with a small amount of the substitution by carrying out the metal-plating processing quickly with large electric current. Moreover, by choosing a suitable metal-plating liquid, it is also possible to control the size of the separating grain.

Figure 6:
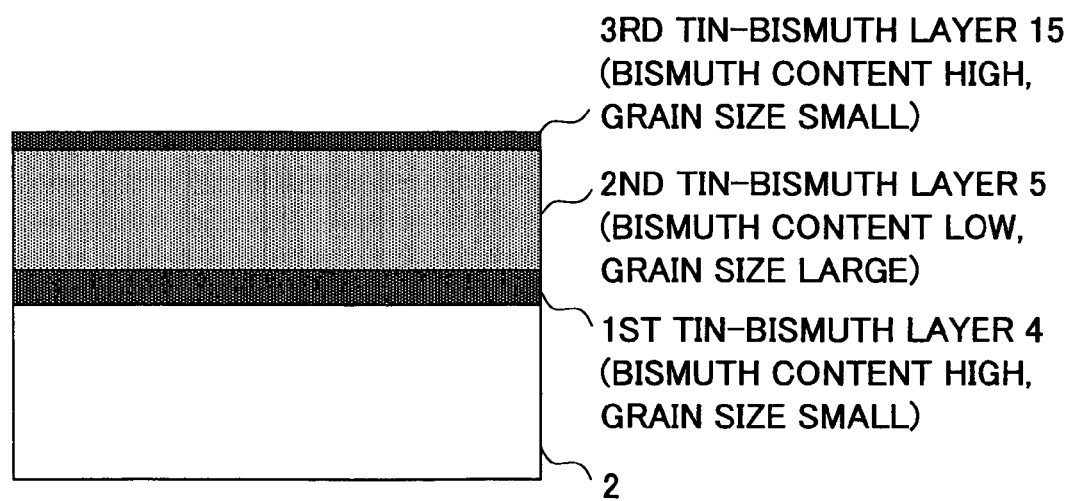
FIG. 6 is a cross-sectional view showing the composition of an example of the multi-layer unleaded metal-plating layers formed on the lead of the semiconductor integrated circuit device of FIG. 1 using the multi-layer unleaded metal-plating method in a second preferred embodiment of the invention.

FIG. 6 shows an example of the multi-layer unleaded metal-plating layers formed on the lead of the semiconductor integrated circuit device of FIG. 1 using the multi-layer unleaded metal-plating method in the second preferred embodiment of the invention.

In the previous embodiment, the grain size of the second unleaded metal-plating layer formed as the surface layer is enlarged, and the appearance of the surface layer has no gloss or semi-gloss. There may be the possibility that the mounting machine or the inspection device does not recognize the presence of the metal-plating layer. A method for overcoming the problem is to form a third, fine-grain, unleaded metal-plating layer on the second unleaded metal-plating layer. It is possible to consider metal-plating appearance as gloss metal plating with the formation of the three-layer structure of the unleaded metal-plating layers.

A description will be given of this three-layer structure of the multi-layer unleaded metal-plating will be described with reference to FIG. 6. In the case of FIG. 6, the tin-bismuth metal plating is used as an example.

The multi-layer unleaded metal-plating method of the present embodiment carries out the multi-layer formation of the three tin-bismuth metal-plating layers (inclusive of 100% tin plating layers) as the inner layer, the middle layer, and the surface layer. The composition and manufacture method in the second preferred embodiment are essentially the same as those in the first preferred embodiment.

As shown in FIG. 6, the first tin-bismuth metal-plating layer 4 is formed on the lead 2 as being the inner layer. The composition of the layer 4 is, for example, tin 96% and bismuth 4%, and the thickness of the layer 4 is about 2 micrometers. The layer 4 is formed as a thin film.

The second tin-bismuth metal-plating layer 5 is formed on the first tin-bismuth metal-plating layer 4 as being the middle layer. The composition of the layer 5 is, for example, tin 99% and bismuth 1%, and the thickness of the layer 5 is about 7 micrometers.

The third tin-bismuth metal-plating layer 15 is formed on the second tin-bismuth metal-plating layer 5 as being the surface layer. The composition of the layer 15 is, for example, tin 96% and bismuth 4%, and the thickness of the layer 15 is about 1 micrometer. The layer 15 is formed as a thin film.

Furthermore, according to the multi-layer unleaded metal-plating method of the present embodiment, the multi-layer formation of the three metal-plating layers is carried out so that the grain size of the first tin-bismuth metal-plating layer 4 and the third tin-bismuth metal-plating layer 15 is comparatively small (about 1 micrometer), and the grain size of the second tin-bismuth metal-plating layer 5 is comparatively large (about 5 micrometers).

Similar to the first preferred embodiment, in the multi-layer unleaded metal plating of the present embodiment, the large ratio of the bismuth content of the inner layer serves as the effective barrier layer to the whisker, and the problem of the metal-plating crack can be improved. In addition, the fine-grain surface metal-plating layer enables the appearance of the metal plating to be kept good.

However, the third tin-bismuth metal-plating layer 15 formed as the surface layer has a large ratio of the bismuth content, and the solder wettability may deteriorate slightly.

Moreover, similar to the manufacture method of the semiconductor device in the first preferred embodiment, the third, fine-grain tin-bismuth metal-plating layer 15 can be formed by performing the metal plating slowly with small electric current using the same metal-plating processing bath after the second tin-bismuth metal-plating layer 5 is formed.

Figure 7:
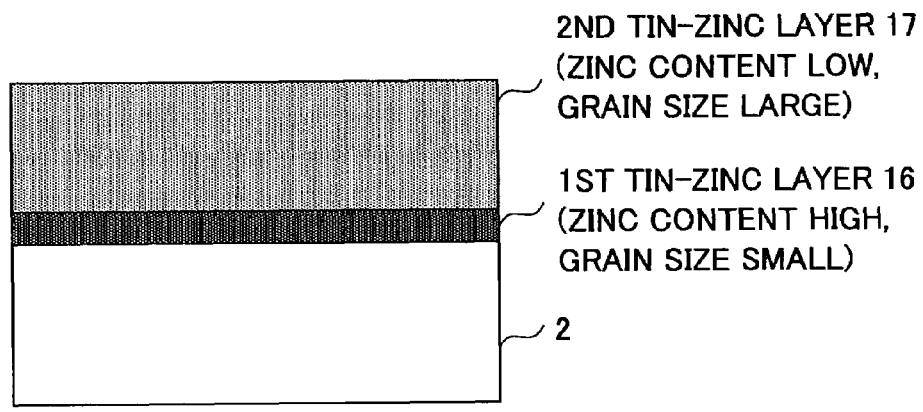
FIG. 7 is a cross-sectional view showing the composition of an example of the multi-layer unleaded metal-plating layers formed on the lead of the semiconductor integrated circuit device of FIG. 1 using the multi-layer unleaded metal-plating method in a third preferred embodiment of the invention.

FIG. 7 shows an example of the multi-layer unleaded metal-plating layers formed on the lead of the semiconductor integrated circuit device of FIG. 1 using the multi-layer unleaded metal-plating method in the third preferred embodiment of the invention.

In the first preferred embodiment, the electrode potential of bismuth, silver and copper is higher than the electrode potential of tin, and the common metal-plating method can be used. However, in the present embodiment, the electrode potential of zinc and indium is lower than the electrode potential of tin, and another metal-plating method must be used. A description will be given of the multi-layer unleaded metal-plating method of the present embodiment by using an example of the multi-layer tin-zinc metal plating of FIG. 7.

The example of the multi-layer tin-zinc metal plating of FIG. 7 is produced by using the multi-layer unleaded metal-plating method of the present embodiment. In the present embodiment, the first tin-zinc metal-plating layer 16 is formed on the lead 2 as being the inner layer. Similar to the previous embodiment, the layer 16 has a large ratio of the zinc content, and the fine-grain metal plating coat is formed in the layer 16. The second tin-zinc metal-plating layer 17 is formed on the first tin-zinc metal-plating layer 16 as being the surface layer. The layer 17 has a small ratio of the zinc content, and the coarse-grain metal plating coat is formed in the layer 17.

With respect to the metal-plating processing device for manufacturing the semiconductor device in the third preferred embodiment, the above-described metal-plating processing device of FIG. 8 in the first preferred embodiment can be used.

On the other hand, with respect to the metal-plating liquid 27 for producing the semiconductor device in the first preferred embodiment, the low-speed metal-plating liquid with which about 1 A/dm$^2$ is used as the optimal processing conditions is chosen. In the first preferred embodiment, the coarse-grain metal-plating coat is formed at the time of passing of the large electric current exceeding the limiting current density.

Unlike the first preferred embodiment, with respect to the metal-plating liquid 27 in the present embodiment, the high-speed metal-plating liquid with which about 10 A/dm$^2$ is used as the optimal processing conditions must be chosen. In the present embodiment, the fine-grain metal-plating coat can be formed at the time of passing of the large electric current.

First, the metal-plating processing of the first layer is performed quickly with the large electric current so that the fine-grain metal-plating coat with the large ratio of the zinc content is formed (the first tin-zinc metal-plating layer 16).

Subsequently, the current density is changed to a smaller current density (for example, about 1 A/dm$^2$). The metal-plating processing of the second layer is performed slowly with the reduced current density using the same metal-plating processing bath 20, so that the coarse-grain metal-plating coat with the small ratio of the zinc content can be formed (the second tin-zinc metal-plating layer 17).

Contrary to the first preferred embodiment, in the present embodiment, the phenomenon in which the zinc in the separated metal-plating coat is replaced by the tin is used, and the zinc content in the metal-plating coat is reduced.

Moreover, the high-speed metal plating processing is performed in the present embodiment, in the small electric current region, the separating grain of the metal-plating becomes coarse, and it is possible to form the coarse-grain metal-plating coat at the time of passing of the small electric current.

The present invention is not limited to the above-described embodiments, and variations and modifications may be made without departing from the scope of the present invention.

What is claimed is:

1. A semiconductor device comprising:
   a semiconductor integrated circuit;
   an external connection terminal connecting the semiconductor integrated circuit to an external device; and
   a plurality of tin or tin-alloy plating layers formed on the external connection terminal as multiple unleaded metal plating layers, wherein the layers comprise:
   a first layer made of a tin alloy and provided as an inner layer of the multiple unleaded metal plating layers, the tin alloy of the first layer containing as a second element one of bismuth, silver, indium, and zinc; and
   a second layer made of a tin alloy and provided as an outer surface layer of the multiple unleaded metal plating layers, the tin alloy of the second layer having a percentage of tin content greater than that of the first layer,
   wherein the tin alloy of the first layer has a grain size equal to or below 1 micrometer and the tin alloy of the second layer has a grain size larger than the grain size of the tin alloy of the first layer.

2. The semiconductor device according to claim 1 wherein the first layer has a thickness smaller than a thickness of the second layer.

3. The semiconductor device according to claim 1 wherein the percentage of tin content of the first layer is 96% or less and the percentage of tin content of the second layer is 99% or more.

4. The semiconductor device according to claim 1 wherein the grain size of the first layer is approximately 1 micrometer and the grain size of the second layer is approximately 5 micrometers.

5. The semiconductor device according to claim 2 wherein the thickness of the first layer is approximately 2 micrometers and the thickness of the second layer is approximately 8 micrometers.

* * * * *